US008278969B2

(12) United States Patent
Ng et al.

(10) Patent No.: US 8,278,969 B2
(45) Date of Patent: Oct. 2, 2012

(54) METHOD AND APPARATUS FOR VOLTAGE LEVEL SHIFTING WITH CONCURRENT SYNCHRONIZATION

(75) Inventors: Ju Tung Ng, Markham (CA); Richard W. Fung, Thornhill (CA); Ricky Lau, Toronto (CA)

(73) Assignee: ATI Technologies ULC, Markham, Ontario (CA)

( * ) Notice: Subject to any disclaimer, the term of this patent is extended or adjusted under 35 U.S.C. 154(b) by 0 days.

(21) Appl. No.: 12/844,415

(22) Filed: Jul. 27, 2010

(65) Prior Publication Data

US 2012/0025870 A1 Feb. 2, 2012

(51) Int. Cl.
*H03K 19/0175* (2006.01)
(52) U.S. Cl. ............... 326/68; 326/81; 326/83; 327/333
(58) Field of Classification Search ............. 326/62–63, 326/68, 80–83, 86–87, 93–98; 327/333
See application file for complete search history.

(56) References Cited

U.S. PATENT DOCUMENTS

| 2003/0030474 | A1* | 2/2003 | McGowan | 327/202 |
| 2008/0290921 | A1* | 11/2008 | Park | 327/212 |

OTHER PUBLICATIONS

Graf, Rudolf, Modern Dictionary of Electronics, 1999, Newnes, 7th Edition, p. 195.*

* cited by examiner

*Primary Examiner* — Shawki S Ismail
*Assistant Examiner* — Jany Tran
(74) *Attorney, Agent, or Firm* — Faegre Baker Daniels LLP

(57) ABSTRACT

Methods and apparatus provide for voltage level shifting with concurrent synchronization. The apparatus includes level shifting logic that in response to a non-level shifted clock signal from a first voltage domain, provides level shifted concurrently synchronous differential data signals in a second voltage domain based on pre-level shifted differential data signals from the first voltage domain. The first voltage domain may be, for example, a core logic voltage domain in which core logic operates. The second voltage domain may be, for example, an input/output (I/O) voltage domain in which an I/O buffer operates. The voltage level of the level shifted concurrently synchronous differential data signals is shifted from the pre-level shifted differential data signals, and the timing of the level shifted concurrently synchronous differential data signals is concurrently referenced to the non-level shifted clock signal.

21 Claims, 7 Drawing Sheets

METHOD AND APPARATUS FOR VOLTAGE LEVEL SHIFTING WITH CONCURRENT SYNCHRONIZATION

BACKGROUND OF THE DISCLOSURE

The disclosure relates generally to methods and apparatus for voltage level shifting.

In integrated circuits having an input/output (I/O) circuit, because internal core logic can operate in an internal core logic voltage domain that is different from an I/O voltage domain in which the I/O circuit operates, voltage level shifting is required to propagate signals from the internal core logic to the I/O circuit. In addition, for high-speed synchronous I/O circuits, the output data signal is typically required to be synchronized with a clock through a flip-flop or a latch prior to being sent out, to clean up signal timing jitter from the upstream data path.

One technique for performing the voltage domain level shifting and the output data signal synchronization is to synchronize the data signal in the lower voltage domain (e.g., an internal core logic voltage domain) with a flip-flop or a latch, then shift the voltage level of the synchronized output data signal to the higher voltage domain (e.g., an I/O voltage domain) so that the signal can be driven out through an I/O buffer. Another technique for performing the voltage domain level shifting and the output data signal synchronization is to shift the voltage level of both the output data signal and the clock signal from the internal core logic voltage domain to the I/O voltage domain, then synchronize the level shifted output data signal with the level shifted clock signal in the I/O voltage domain with a flip-flop or a latch operating on the I/O power rail. Both techniques typically require two separate and sequential operations and corresponding circuits, for example, a synchronization operation followed by a level shifting operating or vice versa. In other words, an asynchronous level shifting scheme is employed by the above-mentioned techniques, which typically adds jitter to the resulting output data signal.

In addition, existing level shifting circuits may only rely on pull-down voltage signals generated by NMOS transistors to flip the logic polarity of the differential output data signals. As such, the duty cycle of the output signal may be distorted by the varying of the internal core logic voltage, especially when the internal core logic voltage is down to near the minimum common-collector voltage (VCCmin) of the technology process.

Accordingly, there exists a need for improved methods and apparatus for voltage level shifting.

BRIEF DESCRIPTION OF THE DRAWINGS

The embodiments will be more readily understood in view of the following description when accompanied by the below figures and wherein like reference numerals represent like elements, wherein.

DETAILED DESCRIPTION OF THE PREFERRED EMBODIMENTS

Figure 1:
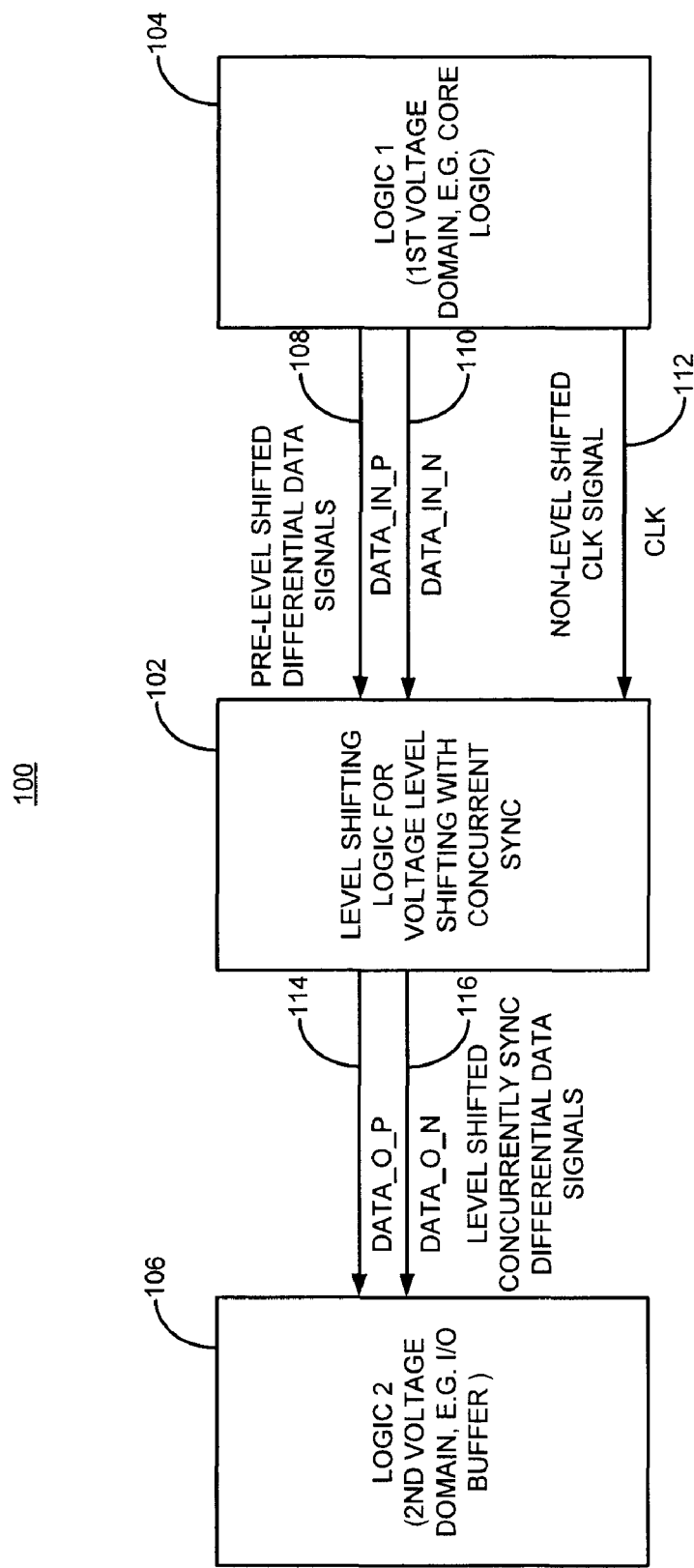
FIG. 1 is a block diagram illustrating one example of an integrated circuit including level shifting logic for voltage level shifting with concurrent synchronization in accordance with one embodiment set forth in the disclosure.

Briefly, methods and apparatus provide for voltage level shifting with concurrent synchronization. In one example, the apparatus includes level shifting logic that, in response to a non-level shifted clock signal from a first voltage domain, provides level shifted concurrently synchronous differential data signals in a second voltage domain based on pre-level shifted differential data signals from the first voltage domain. The first voltage domain may be, for example, a core logic voltage domain in which core logic operates. The second voltage domain may be, for example, an I/O voltage domain in which an I/O buffer operates. The voltage level of the level shifted concurrently synchronous differential data signals is shifted from the pre-level shifted differential data signals, and the timing of the level shifted concurrently synchronous differential data signals is concurrently referenced to the non-level shifted clock signal.

The level shifting logic may include a plurality of current-mode pull-up enhancement circuits. The plurality of current-mode pull-up enhancement circuits, in response to the non-level shifted clock signal from the first voltage domain, generate a plurality of pumping current signals based on the pre-level shifted differential data signals. The level shifting logic may also include a regenerative latch operatively connected to the plurality of current-mode pull-up enhancement circuits. The regenerative latch outputs the level shifted concurrently synchronous differential data signals based on the plurality of pumping current signals.

In one example, each one of the plurality of current-mode pull-up enhancement circuits may include synchronous current gating logic including a plurality of transistors. The synchronous current gating logic generates a reference current signal in response to the non-level shifted clock signal and the pre-level shifted differential data signals from the first voltage domain. Each one of the plurality of current-mode pull-up enhancement circuits may also include a current mirror operatively connected to the synchronous current gating logic. The current mirror generates one of the plurality of pumping current signals that is substantially equal to the reference current signal. The plurality of current-mode pull-up enhancement circuits may alternatively generate at least two pumping current signals. The non-level shifted clock signal from the first voltage domain may be a differential clock signal having a first clock signal and a second clock signal, and the plurality of current-mode pull-up enhancement circuits may generate the plurality of pumping current signals in response to the first clock signal and a delayed second clock signal of the differential clock signal.

In another example, the level shifting logic may include complementary pull-down logic operatively connected to the plurality of current-mode pull-up enhancement circuits and the regenerative latch. The complementary pull-down logic generates a plurality of pull-down voltage signals. The regenerative latch may output the level shifted concurrently synchronous differential data signals based on the plurality of pull-down voltage signals and the plurality of pumping current signals.

In still another example, the level shifting logic may include latching logic operatively connected to the complementary pull-down logic and the plurality of current-mode pull-up enhancement circuits. The latching logic may propagate latched pre-level shifted differential data signals to the complementary pull-down logic and the plurality of current-mode pull-up enhancement circuits.

In yet another example, the apparatus may include first logic operative in the first voltage domain. The first logic may be, for example, core logic, and transmit the non-level shifted clock signal and the pre-level shifted differential data signals to the level shifting logic. The apparatus may also include second logic operative in the second voltage domain. The second logic may be, for example, an I/O buffer, and receive the level shifted concurrently synchronous differential data signals from the level shifting logic.

Among other advantages, the method and apparatus for voltage level shifting with concurrent synchronization provide the ability to level shift and synchronize high-speed data signal at the same time without having to level shift the clock signal, thereby improving the deterministic jitter performance of the circuit. In addition, the duty cycle of the output differential data signals stays relatively constant with varying the internal core logic supply voltage, even down to near the minimum common-collector voltage (VCCmin) of the technology process, due to the existence of the current pumping mechanism to toggle the output polarity of the output differential data signals. Accordingly, the proposed techniques can improve the jitter performance and duty cycle distortion from the conventional techniques. Other advantages will be recognized by those of ordinary skill in the art.

FIG. 1 illustrates one example of an integrated circuit 100 including level shifting logic 102 for voltage level shifting with concurrent synchronization, first logic 104, and second logic 106. The integrated circuit 100 may be any suitable circuit that has the level shifting logic 102, for example, a graphic processor, a central processing unit (CPU), a system controller, an I/O controller or a memory controller, to name a few. The "logic" or "circuits" referred to herein are any suitable circuits that can achieve the desired function, and may be digital circuits, analog circuits, mixed analog-digital circuits or any suitable circuits. The first logic 104 may include but is not limited to core logic operating in a first voltage domain, e.g., a core logic voltage (VDD_CORE). The voltage level of the first voltage domain may be in the range from about 0.8 V to about 1.1 V. The second logic 106 may include but is not limited to an I/O buffer or any suitable I/O circuit known in the art operating in a second voltage domain, e.g., an I/O voltage (VDD_IO). The voltage of the second voltage domain may be in the range from about 1.5 V to about 1.8 V. In this example, the second voltage domain is at the voltage level of 1.8 V for the I/O buffer. It is understood that the integrated circuit 100 including the level shifting logic 102 may not include the first logic 104 and/or the second logic 106.

Figure 5:
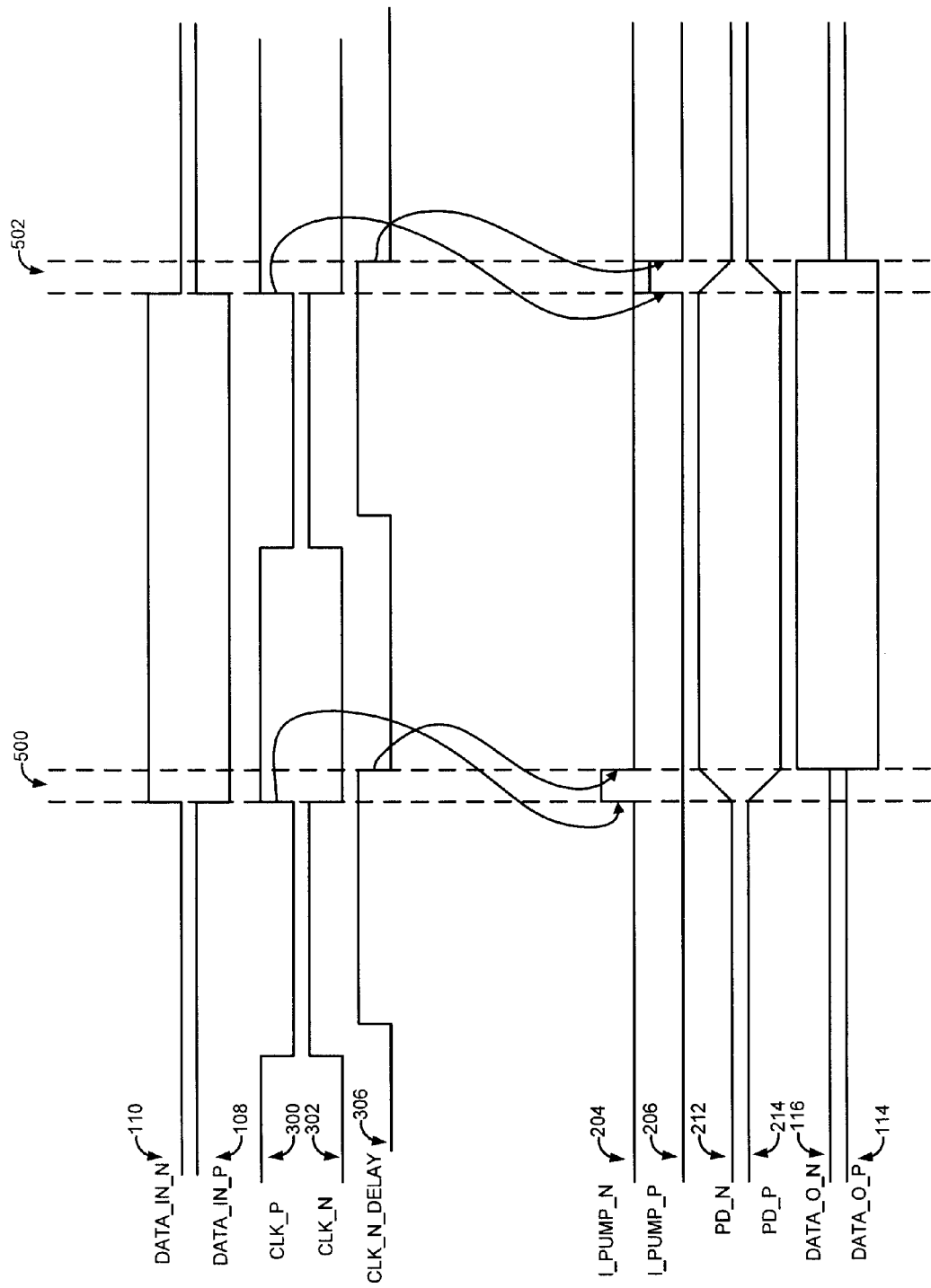
FIG. 5 is a timing diagram illustrating one example of signals of the level shifting logic shown in FIG. 3.

The level shifting logic 102 receives pre-level shifted differential data signals 108, 110 and a non-level shifted clock signal (CLK) 112 from the first logic 104. The pre-level shifted differential data signals 108, 110 and the non-level shifted clock signal 112 are in the first voltage domain. In this example, the pre-level shifted differential data signals 108, 110 are differential data signals that include a first pre-level shifted differential data signal (DATA_IN_P) 108 and a second pre-level shifted differential data signal (DATA_IN_N) 110. As shown in the timing diagram of FIG. 5, the first and second pre-level shifted differential data signals 108, 110 are complementary to each other. The level shifting logic 102 shifts the voltage level of the pre-level shifted differential data signals 108, 110 from the first voltage domain to the second voltage domain, and concurrently synchronizes (retime) the pre-level shifted differential data signals 108, 110 with the non-level shifted clock signal 112 to generate level shifted concurrently synchronous differential data signals 114, 116 (i.e., a first level shifted concurrently synchronous differential data signal DATA_O_P 114, a second level shifted concurrently synchronous differential data signal DATA_O_N 116), which are also complementary to each other as shown in FIG. 5. The non-level shifted clock signal 112 remains at the first voltage domain and is used as the clocking signal for the level shifting logic 102, such that the level shifted concurrently synchronous differential data signals 114, 116 are aligned relative to the non-level shifted clock signal 112. In other words, the timing of the level shifted concurrently synchronous differential data signals 114, 116 is referenced to the non-level shifted clock signal 112. The level shifted concurrently synchronous differential data signals 114, 116 are sent to the second logic (e.g., I/O buffer) 106 in the second voltage domain. In addition, any suitable control signal (not shown) known in the art may be employed for communication between the first logic 104, the level shifting logic 102, and the second logic 106.

Figure 2:
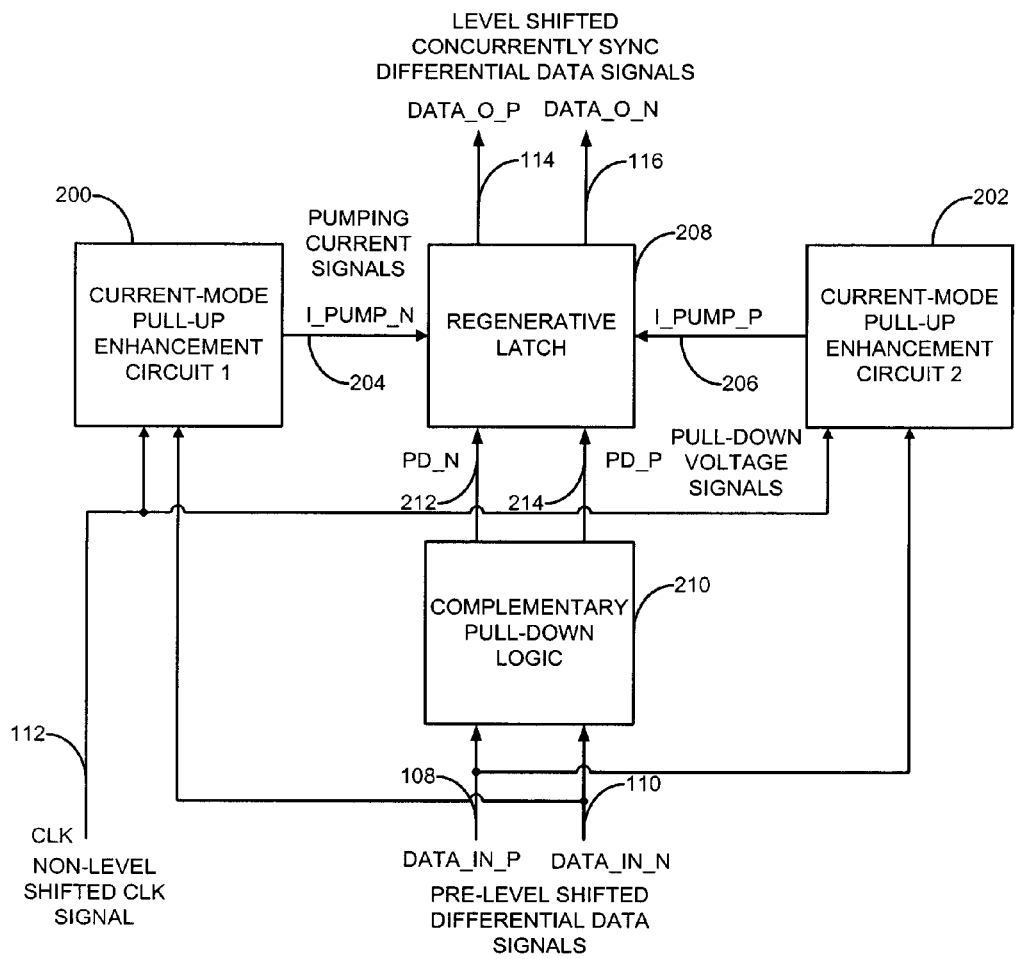
FIG. 2 is a block diagram illustrating one example of the level shifting logic shown in FIG. 1.

FIG. 2 is a block diagram illustrating one example of the level shifting logic 102 in the integrated circuit 100. The level shifting logic 102 includes a plurality of current-mode pull-up enhancement circuits 200, 202, such as a first current-mode pull-up enhancement circuit 200 and a second current-mode pull-up enhancement circuit 202. The current-mode pull-up enhancement circuits 200, 202, in response to the non-level shifted clock signal 112 from the first voltage domain, generate a plurality of pumping current signals 204, 206 (e.g., a first pumping current signal I_PUMP_N 204, a second pumping current signal I_PUMP_P 206) based on the pre-level shifted differential data signals 108, 110. The first current-mode pull-up enhancement circuit 200 receives the non-level shifted clock signal 112 and the second pre-level shifted differential data signal 110, and outputs the first pumping current signal 204. Likewise, the second current-mode pull-up enhancement circuit 202 generates the second pumping current signal 206. In this example, the two pumping current signals 204, 206 are generated alternatively by the two current-mode pull-up enhancement circuits 200, 202, respectively. That is, the two pumping current signals 204, 206 are not generated at the same time as shown in the timing diagram of FIG. 5. Moreover, the two pumping current signals 204, 206 are gated by the non-level shifted clock signal 112 and the pre-level shifted differential data signals 108, 110 using the current-mode pull-up enhancement circuits 200, 202.

As shown in FIG. 2, the level shifting logic 102 may include a regenerative latch 208. In one example, the regenerative latch 208 outputs the level shifted concurrently synchronous differential data signals 114, 116 in the second voltage domain based on the pumping current signals 204, 206. The regenerative latch 208 receives the pumping current signals 204, 206 from the first and second current-mode pull-up enhancement circuits 200, 202, respectively. The outputs of the regenerative latch 208 are the level shifted concurrently synchronous differential data signals 114, 116 in the second voltage domain, which have been level shifted from the pre-level shifted differential data signals 108, 110 in the first voltage domain and been concurrently synchronized with the non-level shifted clock signal 112. The regenerative latch 208 may include, for example, a pair of cross-coupled inverters in the second voltage domain, and the level shifted concurrently synchronous differential data signals 114, 116 are outputted by toggling the logic polarity of the cross-coupled inverters using the pull-up pumping current signals 204, 206. In this example, the current-mode pull-up enhancement circuits 200, 202, combined with the regenerative latch 208, perform both the voltage level shifting and synchronization operations at the same time.

The level shifting logic 102 may also include complementary pull-down logic 210 operatively connected to the current-mode pull-up enhancement circuits 200, 202 and the regenerative latch 208. In this example, the complementary pull-down logic 210 receives the pre-level shifted differential data signals 108, 110, and generates and outputs a plurality of pull-down voltage signals 212, 214 (e.g., a first pull-down voltage signal PD_N 212, a second pull-down voltage signal PD_P 214). The two pull-down voltage signals 212, 214 are complementary to each other as shown in the timing diagram of FIG. 5. In this example, the regenerative latch 208 also receives the pull-down voltage signals 212, 214 from the complementary pull-down logic 210. In addition to the pumping current signals 204, 206 from the current-mode pull-up enhancement circuits 200, 202, the regenerative latch 208 outputs the level shifted concurrently synchronous differential data signals 114, 116 based on the pull-down voltage signals 212, 214 from the complementary pull-down logic 210 as well. In this example, the regenerative latch 208 may include, for example, a pair of cross-coupled inverters, and the level shifted concurrently synchronous differential data signals 114, 116 are outputted by toggling the logic polarity of the cross-coupled inverters using both the pull-up pumping current signals 204, 206 and the pull-down voltage signals 212, 214 at the same time. The details of the level shifting logic 102 are further illustrated in FIG. 3.

Figure 3:
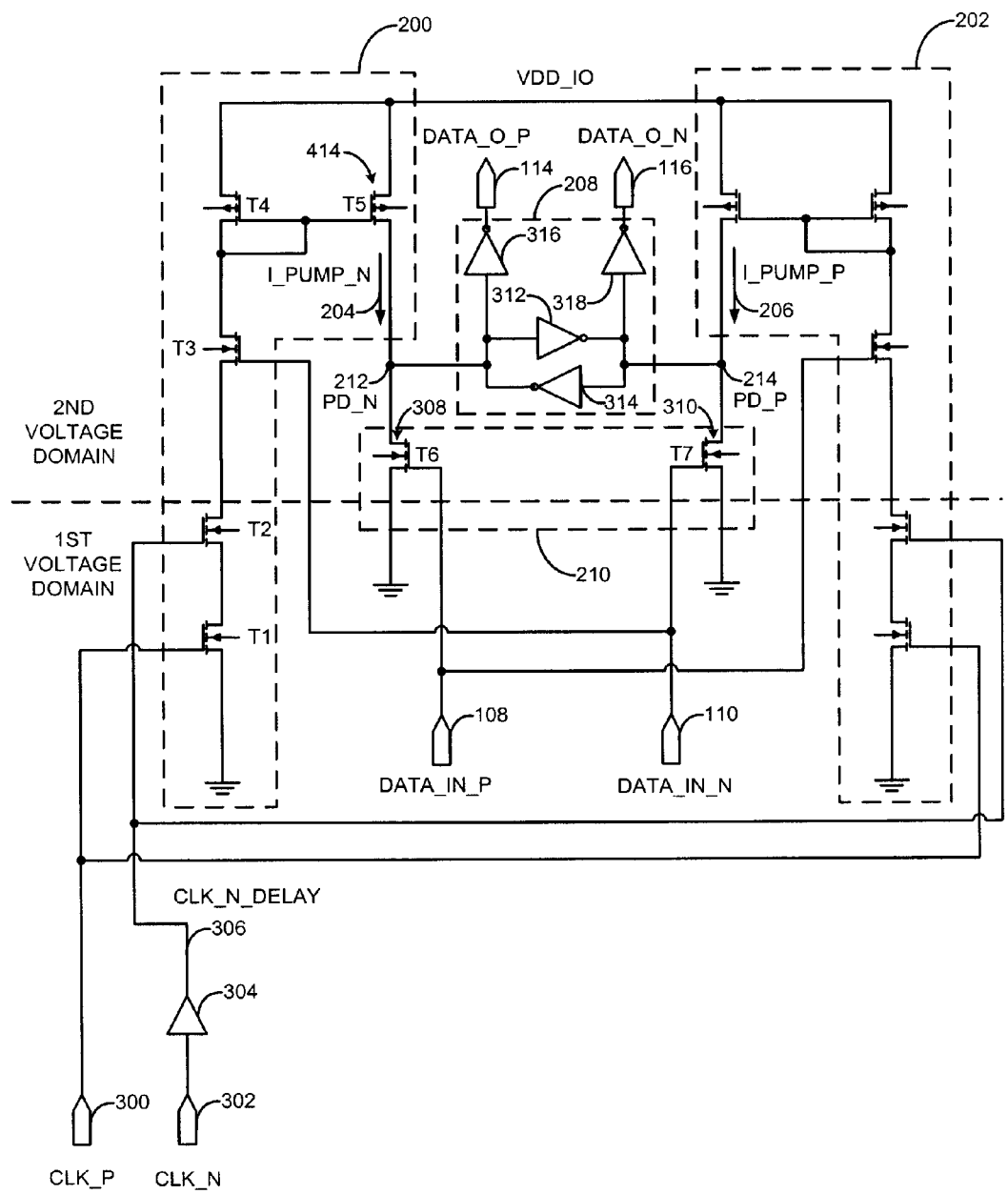
FIG. 3 is a circuit diagram illustrating one example of the level shifting logic shown in FIG. 2.
Figure 4:
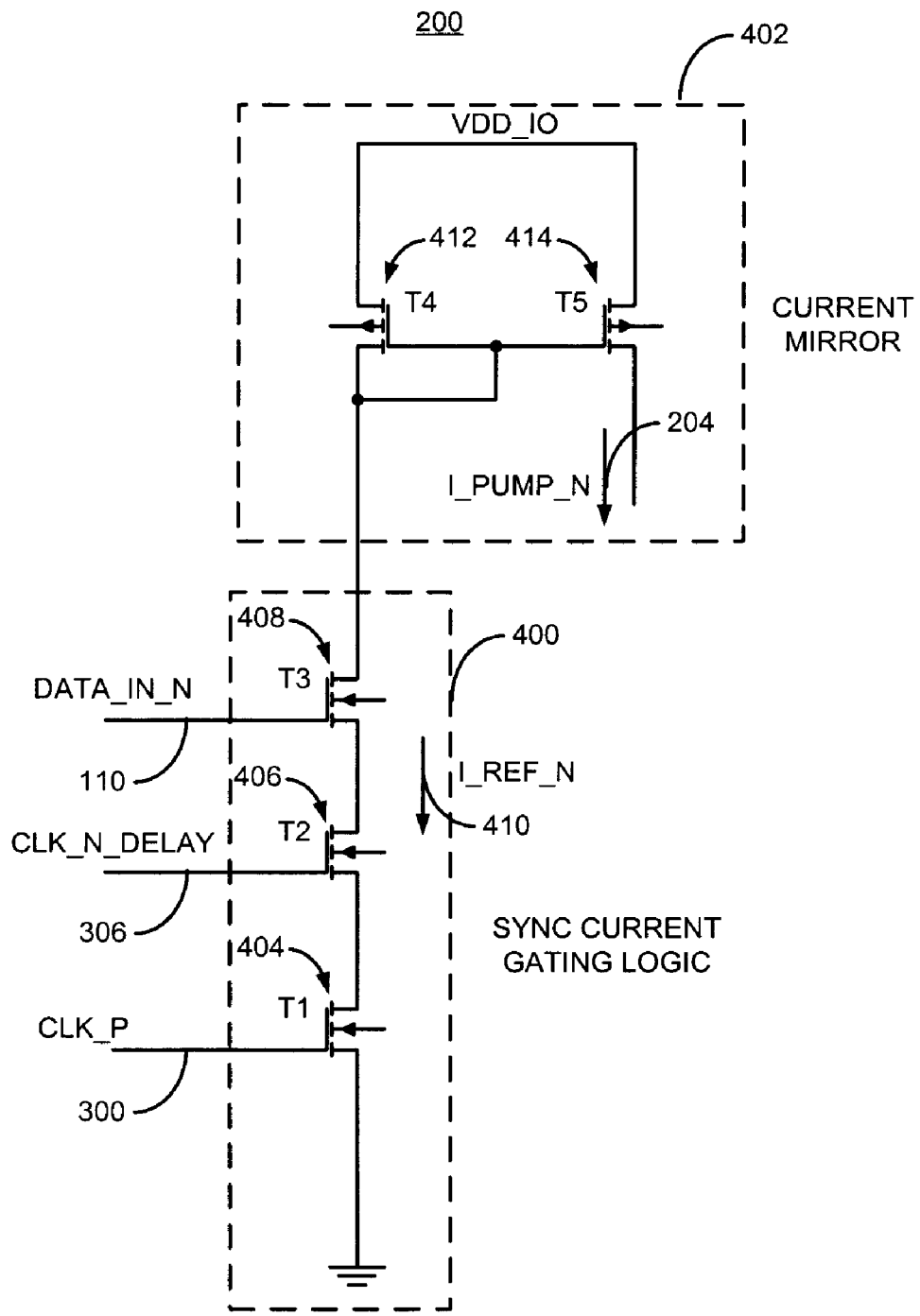
FIG. 4 is a circuit diagram illustrating one example of a current-mode pull-up enhancement circuit in the level shifting logic shown in FIG. 3.

FIG. 3 is a circuit diagram illustrating one example of the level shifting logic 102 in the integrated circuit 100 in accordance with one embodiment of the disclosure. As previously noted, the level shifting logic 102 includes the first and second current-mode pull-up enhancement circuits 200, 202. Also referring to FIG. 4, the first current-mode pull-up enhancement logic 200 includes a first synchronous current gating logic 400 and a first current mirror 402. The first synchronous current gating logic 400 includes a plurality of transistors, such as but not limited to three NMOS transistors 404-408 (i.e., T1 404, T2 406, T3 408) in this example. The first synchronous current gating logic 400 generates a first reference current signal (I_RFE_N) 410 in response to the non-level shifted clock signal 112 and the second pre-level shifted differential data signal 110 from the first voltage domain. In this example, the non-level shifted clock signal 112 from the first voltage domain is a differential clock signal having a first clock signal (CLK_P) 300 and a second clock signal (CLK_N) 302 that are complementary to each other as shown in the timing diagram of FIG. 5. The second clock signal 302 may propagate through a buffer 304 to become a delayed second clock signal (CLK_N_DELAY) 306. The delay time is determined by, for example, the number of the inverters in the buffer 304. In this example, the second clock signal 302 is delayed for about 100 picosec to become the delayed second clock signal 306. The NMOS transistors T1-T3 404-408 are connected as shown in FIG. 4, and the gate of each NMOS transistor T1-T3 404-408 is connected to the first clock signal 300, the delayed second clock signal 306, and the second pre-level shifted differential data signal 110, respectively.

The first current mirror 402 may be, as known in the art, a circuit designed to copy a current through one active branch by controlling the current in another active branch of a circuit, keeping the output current constant regardless of loading. In this example, the first current mirror 402 includes two PMOS transistors 412, 414 (i.e., T4 412, T5 414) connected as shown in FIG. 4, and the supply voltage of the PMOS transistors 412, 414 is the I/O voltage (VDD_IO) in the second voltage domain, for example, is 1.8 V. In operation, the first current mirror 402 generates the first pumping current signal 204 that is substantially equal to the first reference current signal 410.

Also referring to the timing diagram of FIG. 5, in operation, when the first clock signal 300, the delayed second clock signal 306, and the second pre-level shifted differential data signal 110 are all logic high (see time period 500 in FIG. 5), the NMOS transistors T1-T3 404-408 in the first synchronous current gating logic 400 are all turned on, and thus, generate the first reference current signal 410 and the first pumping current signal 204 (i.e., the first pumping current signal 204 is logic high during the time period 500). Otherwise, if any one of the gate signals of the NMOS transistors T1-T3 404-408 is logic low, at least one of the NMOS transistors T1-T3 404-408 is turned off, such that the first reference current signal 410 and the first pumping current signal 204 become logic low. In other words, the first pumping current signal 204 is gated by the non-level shifted clock signal 112 and the second pre-level shifted differential data signals 110 using the first current-mode pull-up enhancement circuit 200. Likewise, the second pumping current signal 206, as shown in FIG. 3, is gated by the non-level shifted clock signal 112 and the first pre-level shifted differential data signals 108 using the second current-mode pull-up enhancement circuit 202. As previously noted, as the pre-level shifted differential data signals 108, 110 are complementary to each other, the first and second pumping current signals 204, 206 are not generated at the same time as shown in FIG. 5. That is, in response to the non-level shifted clock signal 112, the first and second current-mode pull-up enhancement circuits 200, 202 alternatively generate the two pumping current signals 204, 206 based on the pre-level shifted differential data signals 108, 110. As shown in FIG. 5, the first pumping current signal 204 is generated (i.e., logic high) at the time period 500 while the second pumping current signal 206 is generated (i.e., logic high) at time period 502.

Still referring to FIG. 3, the level shifting logic 102 may include the complementary pull-down logic 210 operatively connected to the first and second current-mode pull-up enhancement circuits 200, 202. In this example, the complementary pull-down logic 210 includes two NMOS transistors 308, 310 (i.e., a first NMOS transistor T6 308, a second NMOS transistor T7 310). The drain of the first NMOS transistor T6 308 is connected to the drain of the PMOS transistor T5 414 of the first current-mode pull-up enhancement circuit 200, and the gate of the first NMOS transistor T6 308 is connected to the first pre-level shifted differential data signal 108. As shown in the timing diagram of FIG. 5, in operation, when the first pre-level shifted differential data signal 108 is logic high, the first NMOS transistor T6 308 is turned on, and thus, the drain voltage (i.e., the first pull-down voltage signal 212) of the first NMOS transistor T6 308 becomes logic low; and when the first pre-level shifted differential data signal 108 is logic low (see time period 500 in FIG. 5), the transistor T6 308 is turned off, and the first pumping current signal 204 pulls up the first pull-down voltage signal 212 to logic high. Likewise, the drain voltage signal (i.e., the second pull-down voltage signal 214) of the second NMOS transistor T7 310 is gated by the second pre-level shifted differential data signal 110. As the two pre-level shifted differential data signals 108, 110 are complementary to each other, the two pull-down voltage signals 212, 214 are also complementary to each other as shown in FIG. 5.

Still referring to FIG. 3, the level shifting logic 102 may include the regenerative latch 208 operatively connected to the first and second current-mode pull-up enhancement circuits 200, 202 and the complementary pull-down logic 210. In this example, the regenerative latch 208 includes a pair of cross-coupled inverters 312, 314 and other inverters 316, 318 in the second voltage domain. The regenerative latch 208 outputs the level shifted concurrently synchronous differential data signals 114, 116 by toggling the output polarity based on both the pull-up pumping current signals 204, 206 and pull-down voltage signals 212, 214 at the same time.

As shown in the timing diagram of FIG. 5, in operation, when the second pre-level shifted differential data signal 110, the first clock signal 300, and the delayed second clock signal 306 are all logic high (see time period 500 in FIG. 5), the first pumping current signal 204 is logic high, and the first pull-down voltage signal 212 is pulled up to logic high as well. In the meantime, the second pumping current signal 206 still keeps logic low, and the second pull-down voltage signal 214 of the complementary pull-down logic 210 becomes logic low. The voltage level shifting operation is done by both the NMOS pull-down voltage signals and pumping current pulses applied to the regenerative latch 208 at the same time. Accordingly, the first level shifted concurrently synchronous differential data signal 114 of the regenerative latch 208 becomes logic low and the second level shifted concurrently synchronous differential data signal 116 becomes logic high. In other words, the level shifted concurrently synchronous differential data signals 114, 116 follow the pattern of the pre-level shifted differential data signals 108, 110, while the voltage level is changed from the first voltage domain to the second voltage domain.

Moreover, at the same time, as the pumping current signals 204, 206 are gated by the non-level shifted clock signal 112, the level shifted concurrently synchronous differential data signals 114, 116 are also synchronized with the non-level shifted clock signal 112 without having to level shift the clock signal, thereby reducing the deterministic jitter. It is noted that, as the synchronous level shifting operation is done by both NMOS pull-down voltage and the PMOS current pumping pulse applied at the same time, the duty cycle distortion by the varying of the first voltage domain voltage level (e.g., VDD_CORE) is minimized. In particular, even when VDD_CORE is down to near the VCCmin of the technology process, due to the weak turn on of the NMOS pull-downs controlled by the pull-down voltage signals 212, 214, the polarity toggling at the regenerative latch 208 is primarily done by the pull-up pumping current signals 204, 206.

Figure 6:
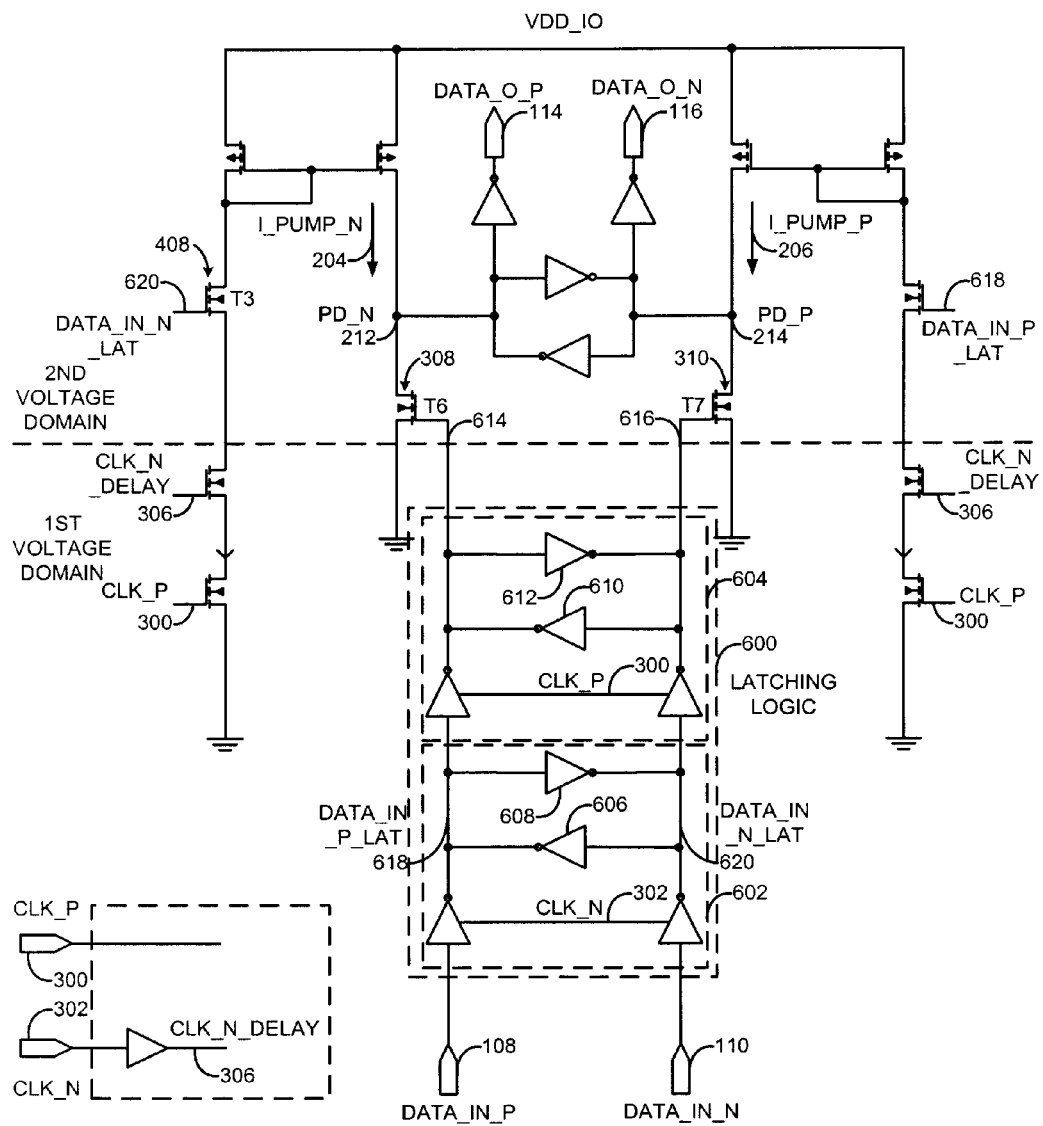
FIG. 6 is a circuit diagram illustrating another example of the level shifting logic shown in FIG. 1 in accordance with one embodiment set forth in the disclosure.

FIG. 6 is a circuit diagram illustrating another example of the level shifting logic 102 in the integrated circuit 100 in accordance with one embodiment of the disclosure. In this example, the level shifting logic 102 may also include latching logic 600 operatively connected to the complementary pull-down logic 210 and the first and second current-mode pull-up enhancement circuits 200, 202. In this example, the latching logic 600 is a master-slave flip-flop that includes a master latch 602 clocked by the second clock signal 302, and a slave latch 604 clocked by the first clock signal 300. Each latch 602, 604, in this example, includes a pair of cross-coupled inverters 606-612. The pre-level shifted differential data signals 108, 110 propagate through the latching logic 600 and become propagated pre-level shifted differential data signals 614, 616 that are aligned with the non-level shifted clock signal 112 (i.e., the first clock signal 300 and the second clock signal 302). The propagated pre-level shifted differential data signals 614, 616, in this example, are used to gate the NMOS transistors (i.e., T6 308, T7 310) in the complementary pull-down logic 210. As such, the pull-down voltage signals 212, 214 generated by the complementary pull-down logic 210 are also synchronized with the non-level shifted clock signal 112. The regenerative latch 208 outputs the level shifted concurrently synchronous differential data signals 114, 116 based on the pumping current signals 204, 206 and the pull-down voltage signals 212, 214, which are all referenced to the non-level shifted clock signal 112.

As shown in FIG. 6, the pre-level shifted differential data signals 108, 110 first propagate through the master logic 602 and become latched pre-level shifted differential data signals 618, 620 (i.e., the first latched pre-level shifted differential data signal DATA_IN_P_LAT 618, the second latched pre-level shifted differential data signal DATA_IN_N_LAT 620) that are aligned with the second clock signal 302 of the non-level shifted clock signal 112. In this example, instead of using the pre-level shifted differential data signals 108, 110, the latched pre-level shifted differential data signals 618, 620 are used to gate the NMOS transistors (e.g., T3 408) in the first and second current-mode pull-up enhancement circuits 200, 202. As such, the timing of the pumping currents signals 204, 206 are also referenced to the second clock signal 302, in addition to the first clock signal 300 and the delayed second clock signal 306 as previously noted. In this example, the non-level shifted clock signal 112 is responsible for clocking in the pre-level shifted differential data signals 108, 110 to the complementary pull-down logic 210, as well as generating the corresponding pumping current signals 204, 206.

Accordingly, in this example, the signal characteristics of the level shifted concurrently synchronous differential data signals 114, 116, especially when the bit rate of the data signal is at multi-Gbit/s level, are improved as the timing is further enhanced and the jitter is further reduced by adding the latching logic 600.

Figure 7:
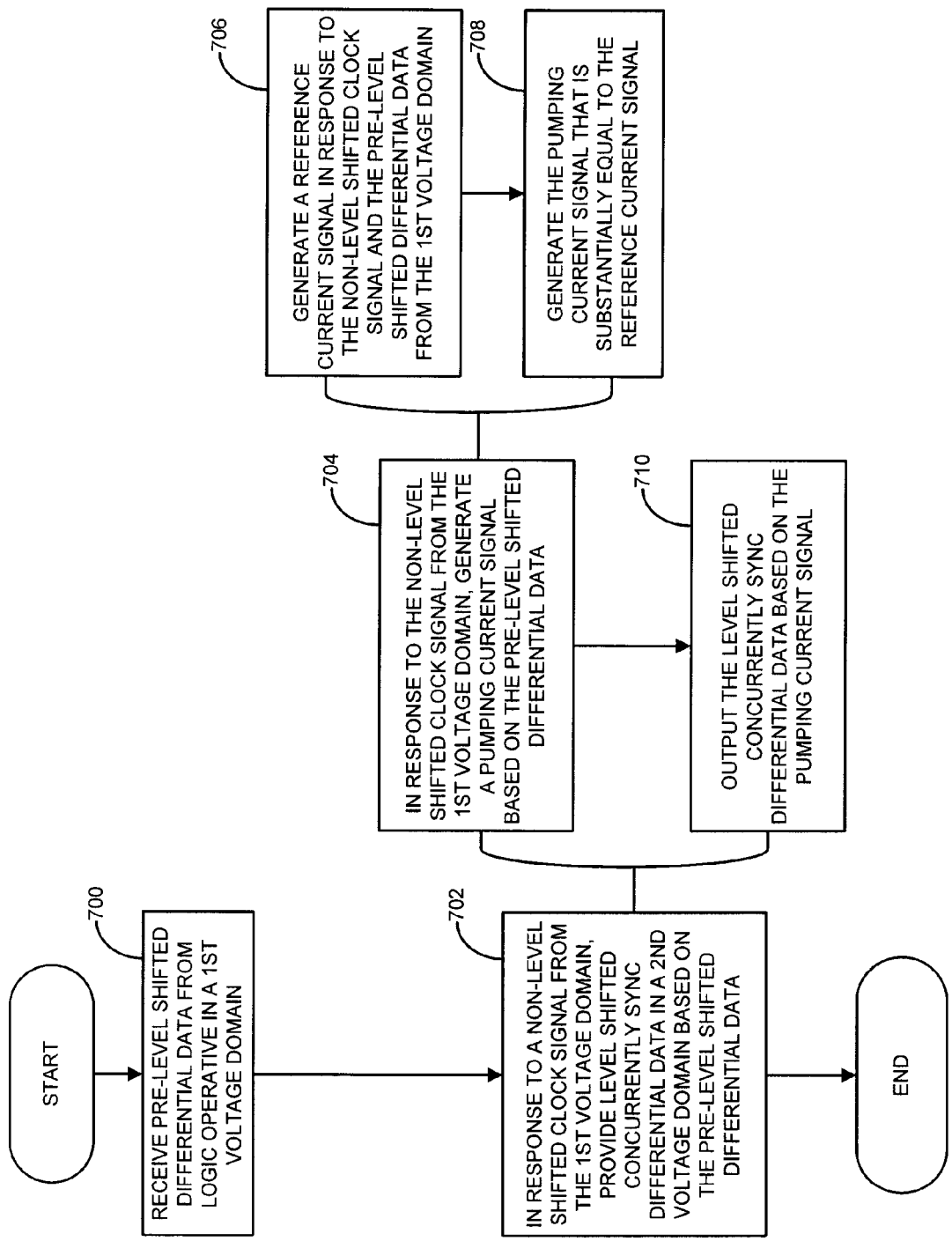
FIG. 7 is a flowchart illustrating one example of a method for voltage level shifting with concurrent synchronization in accordance with one embodiment set forth in the disclosure.

FIG. 7 illustrates one example of a method for voltage level shifting with concurrent synchronization. It will be described with reference to the above figures. However, any suitable logic or circuit may be employed. At block 700, the level shifting logic 102 receives pre-level shifted differential data signals 108, 110 from logic 104 operative in the first voltage domain. At block 702, the level shifting logic 102, in response to the non-level shifted clock signal 112 from the first voltage domain, provides level shifted concurrently synchronous differential data signals 114, 116 in the second voltage domain based on the pre-level shifted differential data signals 108, 110. The voltage level of the level shifted concurrently synchronous differential data signals 114, 116 is shifted from the pre-level shifted differential data signals 108, 110, and the timing of the level shifted concurrently synchronous differential data signals 114, 116 is concurrently referenced to the non-level shifted clock signal 112.

Block 702 may include, at block 704, in response to the non-level shifted clock signal 112 from the first voltage domain, generating pumping current signals 204, 206, by the current-mode pull-up enhancement circuits 200, 202, based on the pre-level shifted differential data signals 108, 110. In one example, block 704 may further include blocks 706 and 708. At block 706, the first reference current signal 410 may be generated, by the first synchronous current gating logic 400, in response to the non-level shifted clock signal 112 and the second pre-level shifted differential data signal 110 from the first voltage domain. Then at block 708, the first pumping current signal 204 that is substantially equal to the first reference current signal 410 is generated by the first current mirror 402.

Block 702 may also include, at block 710, outputting the level shifted concurrently synchronous differential data signals 114, 116, by the regenerative latch 208, based on the pumping current signals 204, 206. The pull-up current pump mechanism by the pumping current signals 204, 206 toggles the output polarity of the regenerative latch 208 to generate the level shifted concurrently synchronous differential data signals 114, 116 and to achieve the voltage level shifting. At the same time, as the pumping current signals 204, 206 are gated by the non-level shifted clock signal 112 at block 704, the synchronization of the level shifted concurrently synchronous differential data signals 114, 116 is achieved concurrently.

Also, integrated circuit design systems (e.g., work stations) are known that create wafers with integrated circuits based on executable instructions stored on a computer readable medium such as but not limited to CDROM, RAM, other forms of ROM, hard drives, distributed memory, etc. The instructions may be represented by any suitable language such as but not limited to hardware descriptor language (HDL), Verilog or other suitable language. As such, the logic and circuits described herein may also be produced as integrated circuits by such systems using the computer readable medium with instructions stored therein. For example, an integrated circuit with the aforedescribed logic and circuits may be created using such integrated circuit fabrication systems. The computer readable medium stores instructions executable by one or more integrated circuit design systems that causes the one or more integrated circuit design systems to design an integrated circuit. The designed integrated circuit includes level shifting logic that is operative to, in response to a non-level shifted clock signal from a first voltage domain, provide level shifted concurrently synchronous differential data signals in a second voltage domain based on pre-level shifted differential data signals from the first voltage domain, as well as other structure as disclosed herein.

Among other advantages, the method and apparatus for voltage level shifting with concurrent synchronization provide the ability to level shift and synchronize high-speed data signal at the same time without having to level shift the clock signal, thereby improving the deterministic jitter performance of the circuit. In addition, the duty cycle of the output differential data signals stays relatively constant with varying the internal core logic supply voltage, even down to near the minimum common-collector voltage (VCCmin) of the technology process, due to the existence of the current pumping mechanism to toggle the output polarity of the output differential data signals. Accordingly, the proposed techniques can improve the jitter performance and duty cycle distortion from the conventional techniques. Other advantages will be recognized by those of ordinary skill in the art.

The above detailed description of the invention and the examples described therein have been presented for the purposes of illustration and description only and not by limitation. It is therefore contemplated that the present invention cover any and all modifications, variations or equivalents that fall within the spirit and scope of the basic underlying principles disclosed above and claimed herein.

The invention claimed is:

1. An integrated circuit comprising level shifting logic operative to, in response to a non-level shifted clock signal from a first voltage domain, provide level shifted concurrently synchronous differential data signals in a second voltage domain based on input pre-level shifted differential data signals from the first voltage domain received by the level shifting logic, wherein the level shifting logic comprises current mirrors operable to alternatively generate pumping current signals based on the input pre-level shifted differential data signals.

2. The integrated circuit of claim 1, wherein the timing of the level shifted concurrently synchronous differential data signals is referenced to the non-level shifted clock signal from the first voltage domain.

3. The integrated circuit of claim 1 further comprising:
first logic, operative in the first voltage domain, operative to transmit the non-level shifted clock signal and the pre-level shifted differential data signals to the level shifting logic; and
second logic, operative in the second voltage domain, operative to receive the level shifted concurrently synchronous differential data signals from the level shifting logic.

4. An integrated circuit comprising level shifting logic operative to, in response to a non-level shifted clock signal from a first voltage domain, provide level shifted concurrently synchronous differential data signals in a second voltage domain based on pre-level shifted differential data signals from the first voltage domain, wherein the level shifting logic comprises a plurality of current-mode pull-up enhancement circuits operative to, in response to the non-level shifted clock signal from the first voltage domain, generate a plurality of pumping current signals based on the pre-level shifted differential data signals.

5. The integrated circuit of claim 4, wherein the level shifting logic further comprises a regenerative latch, operatively connected to the plurality of current-mode pull-up enhancement circuits, operative to output the level shifted concurrently synchronous differential data signals based on the plurality of pumping current signals.

6. The integrated circuit of claim 5, wherein the level shifting logic further comprises complementary pull-down logic, operatively connected to the plurality of current-mode pull-up enhancement circuits and the regenerative latch, operative to generate a plurality of pull-down voltage signals,
wherein the regenerative latch is operative to output the level shifted concurrently synchronous differential based on the plurality of pull-down voltage signals and the plurality of pumping current signals.

7. The integrated circuit of claim 6, wherein the level shifting logic further comprises latching logic, operatively connected to the complementary pull-down logic and the plurality of current-mode pull-up enhancement circuits, operative to propagate latched pre-level shifted differential data signals to the complementary pull-down logic and the plurality of current-mode pull-up enhancement circuits.

8. The integrated circuit of claim 4, wherein each one of the plurality of current-mode pull-up enhancement circuits comprises:
synchronous current gating logic comprising a plurality of transistors, operative to generate a reference current signal in response to the non-level shifted clock signal and the pre-level shifted differential data signals from the first voltage domain; and
a current mirror, operatively connected to the synchronous current gating logic, operative to generate one of the plurality of pumping current signals that is substantially equal to the reference current signal.

9. The integrated circuit of claim 4, wherein the plurality of current-mode pull-up enhancement circuits are operative to alternatively generate at least two pumping current signals.

10. The integrated circuit of claim 4, wherein the non-level shifted clock signal from the first voltage domain is a differential clock signal having a first clock signal and a second clock signal; and wherein the plurality of current-mode pull-up enhancement circuits are operative to generate the plurality of pumping current signals in response to the first clock signal and a delayed second clock signal of the differential clock signal.

11. Level shifting logic comprising:

a plurality of current-mode pull-up enhancement circuits operative to, in response to a non-level shifted clock signal from a first voltage domain, generate a plurality of pumping current signals based on pre-level shifted differential data signals from the first voltage domain; and a regenerative latch, operatively connected to the plurality of current-mode pull-up enhancement circuits, operative to output level shifted concurrently synchronous differential data signals in a second voltage domain based on the plurality of pumping current signals.

12. The level shifting logic of claim 11, wherein each one of the plurality of current-mode pull-up enhancement circuits comprises:

synchronous current gating logic comprising a plurality of transistors, operative to generate a reference current signal in response to the non-level shifted clock signal and the pre-level shifted differential data signals from the first voltage domain; and a current mirror, operatively connected to the synchronous current gating logic, operative to generate one of the plurality of pumping current signals that is substantially equal to the reference current signal.

13. The level shifting logic of claim 11, wherein the plurality of current-mode pull-up enhancement circuits are operative to alternatively generate at least two pumping current signals.

14. The level shifting logic of claim 11, wherein the non-level shifted clock signal from the first voltage domain is a differential clock signal having a first clock signal and a second clock signal; and wherein the plurality of current-mode pull-up enhancement circuits are operative to generate the plurality of pumping current signals in response to the first clock signal and a delayed second clock signal of the differential clock signal.

15. The level shifting logic of claim 11 further comprising complementary pull-down logic, operatively connected to the plurality of current-mode pull-up enhancement circuits and the regenerative latch, operative to generate a plurality of pull-down voltage signals, wherein the regenerative latch is operative to output the level shifted concurrently synchronous differential based on the plurality of pull-down voltage signals and the plurality of pumping current signals.

16. The level shifting logic of claim 15 further comprising latching logic, operatively connected to the complementary pull-down logic and the plurality of current-mode pull-up enhancement circuits, operative to propagate latched pre-level shifted differentia data signals to the complementary pull-down logic and the plurality of current-mode pull-up enhancement circuits.

17. The level shifting logic of claim 11, wherein the timing of the level shifted concurrently synchronous differential data signals is referenced to the non-level shifted clock signal from the first voltage domain.

18. A method carried out by an electronic device comprising:

receiving input pre-level shifted differential data signals from logic operative in a first voltage domain;

in response to a non-level shifted clock signal from the first voltage domain, alternatively generate pumping current signals based on the input pre-level shifted differential data signals; and providing level shifted concurrently synchronous differential data signals in a second voltage domain based on the pumping current signals.

19. A method carried out by an electronic device comprising:

receiving pre-level shifted differential data signals from logic operative in a first voltage domain; and in response to a non-level shifted clock signal from the first voltage domain, providing level shifted concurrently synchronous differential data signals in a second voltage domain based on the pre-level shifted differential data signals, wherein providing the level shifted concurrently synchronous differential data signals comprises:

in response to the non-level shifted clock signal from the first voltage domain, generating a pumping current signal based on the pre-level shifted differential data signals; and outputting the level shifted concurrently synchronous differential data signals based on the pumping current signal.

20. The method of claim 19, wherein generating the pumping current signal comprises:

generating a reference current signal in response to the non-level shifted clock signal and the pre-level shifted differential data signals from the first voltage domain; and generating the pumping current signal that is substantially equal to the reference current signal.

21. A non-transitory computer readable medium storing instructions executable by one or more integrated circuit design systems that causes the one or more integrated circuit design systems to design an integrated circuit comprising level shifting logic operative to, in response to a non-level shifted clock signal from a first voltage domain, provide level shifted concurrently synchronous differential data signals in a second voltage domain based on input pre-level shifted differential data signals from the first voltage domain received by the level shifting logic, wherein the level shifting logic comprises current mirrors operable to alternatively generate pumping current signals based on the pre-level shifted differential data signals.

* * * * *